(12) United States Patent
Park et al.

(10) Patent No.: US 12,310,254 B2
(45) Date of Patent: May 20, 2025

(54) MAGNETIC DEVICE

(71) Applicant: Samsung Electronics Co., Ltd., Suwon-si (KR)

(72) Inventors: Sanghwan Park, Suwon-si (KR); Younghyun Kim, Seoul (KR); Jaehoon Kim, Seoul (KR); Jeongheon Park, Hwaseong-si (KR); Sechung Oh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 387 days.

(21) Appl. No.: 17/720,591

(22) Filed: Apr. 14, 2022

(65) Prior Publication Data

US 2023/0074141 A1    Mar. 9, 2023

(30) Foreign Application Priority Data

Sep. 3, 2021 (KR) .......................... 10-2021-0117948

(51) Int. Cl.
| | |
|---|---|
| *H10N 50/10* | (2023.01) |
| *H01F 10/32* | (2006.01) |
| *H10B 61/00* | (2023.01) |
| *H10N 50/01* | (2023.01) |
| *H10N 50/80* | (2023.01) |
| *H10N 50/85* | (2023.01) |

(52) U.S. Cl.
CPC ......... *H10N 50/80* (2023.02); *H01F 10/3254* (2013.01); *H01F 10/3272* (2013.01); *H10B 61/22* (2023.02); *H10N 50/01* (2023.02); *H10N 50/85* (2023.02)

(58) Field of Classification Search
CPC ........ H10N 50/80; H10N 50/01; H10N 50/85; H10N 50/10; H01F 10/3254; H01F 10/3272; H10B 61/22; G11C 11/161
See application file for complete search history.

(56) References Cited

U.S. PATENT DOCUMENTS

| | | | |
|---|---|---|---|
| 9,343,090 B1 * | 5/2016 | Nishioka | .............. G11B 5/3909 |
| 9,590,010 B1 * | 3/2017 | Gottwald | .............. H10N 50/01 |
| 9,837,468 B2 | 12/2017 | Kim et al. | |
| 9,972,773 B1 | 5/2018 | Lee et al. | |

(Continued)

FOREIGN PATENT DOCUMENTS

| | | |
|---|---|---|
| KR | 20170044337 A | 4/2017 |
| KR | 20210098579 A | 8/2021 |

*Primary Examiner* — David Vu
*Assistant Examiner* — Brandon C Fox
(74) *Attorney, Agent, or Firm* — Myers Bigel, P.A.

(57) ABSTRACT

A magnetic device includes a seed pattern, a reference magnetic structure on the seed pattern, a free magnetic pattern on the reference magnetic structure, and a tunnel barrier between the reference magnetic structure and the free magnetic pattern. The reference magnetic structure includes a synthetic antiferromagnetic (SAF) structure including a first fixed pattern in contact with an upper surface of the seed pattern, an antiferromagnetic coupling pattern in contact with an upper surface of the first fixed pattern, and a second fixed pattern in contact with an upper surface of the antiferromagnetic coupling pattern; a nonmagnetic pattern in contact with an upper surface of the second fixed pattern; and a polarization reinforcement magnetic pattern in contact with an upper surface of the nonmagnetic pattern.

18 Claims, 16 Drawing Sheets

(56) References Cited

U.S. PATENT DOCUMENTS

| | | |
|---|---|---|
| 10,784,442 B2 | 9/2020 | Kim et al. |
| 10,879,454 B2 | 12/2020 | Kardasz et al. |
| 2014/0027869 A1* | 1/2014 | Lee ......................... G11C 11/15 |
| | | 257/421 |
| 2017/0110650 A1* | 4/2017 | Park ....................... H10B 61/22 |
| 2017/0110651 A1* | 4/2017 | Park ....................... H10N 50/80 |
| 2019/0198566 A1* | 6/2019 | Wang ..................... H10N 50/80 |
| 2020/0005845 A1 | 1/2020 | Gupta et al. |
| 2020/0388425 A1 | 12/2020 | Jung et al. |
| 2021/0020829 A1 | 1/2021 | Park et al. |
| 2021/0134504 A1* | 5/2021 | Ma ...................... H01F 10/3259 |
| 2021/0175284 A1 | 6/2021 | Ouellette et al. |
| 2021/0242396 A1* | 8/2021 | Kim ...................... H10B 61/00 |
| 2022/0130581 A1* | 4/2022 | Kim .................... H01F 10/3254 |

* cited by examiner

MAGNETIC DEVICE

CROSS-REFERENCE TO RELATED APPLICATION

This application is based on and claims priority under 35 U.S.C. § 119 to Korean Patent Application No. 10-2021-0117948, filed on Sep. 3, 2021, in the Korean Intellectual Property Office, the disclosure of which is incorporated by reference herein in its entirety.

The inventive concept relates to a magnetic device, and particularly, to a magnetic device including a magnetic layer having perpendicular magnetic anisotropy (PMA).

BACKGROUND

Research for electronic elements using a magnetoresistive characteristic of a magnetic tunnel junction (MTJ) has been conducted. In particular, along with the miniaturization of an MTJ cell in highly integrated magnetic random access memory (MRAM) devices, spin transfer torque-magnetoresistive random access memory (STT-MRAM) has received attention. STT-MRAM may operate by storing information by a physical phenomenon called STT by directly applying a current to an MTJ cell to induce magnetization reversal. In light of increased demand for high integration and/or low power consumption in highly integrated STT-MRAM, various research for satisfying this demand has been conducted.

SUMMARY

The inventive concept provides a magnetic device having reliability improved by reducing or minimizing negative effects of a magnetic field applied from a fixed layer to the surroundings of the fixed layer.

According to an aspect of the inventive concept, a magnetic device includes: a seed pattern on a substrate; a reference magnetic structure on the seed pattern; a free magnetic pattern on the reference magnetic structure; and a tunnel barrier between the reference magnetic structure and the free magnetic pattern. The reference magnetic structure includes: a synthetic antiferromagnetic (SAF) structure including a first fixed pattern in contact with an upper surface of the seed pattern, an antiferromagnetic coupling pattern in contact with an upper surface of the first fixed pattern, and a second fixed pattern in contact with an upper surface of the antiferromagnetic coupling pattern; a nonmagnetic pattern in contact with an upper surface of the second fixed pattern; and a polarization reinforcement magnetic pattern in contact with an upper surface of the nonmagnetic pattern.

According to another aspect of the inventive concept, a magnetic device includes: a seed pattern on a substrate; and a magnetic tunnel junction (MTJ) structure on the seed pattern. The MTJ structure includes a reference magnetic structure, a free magnetic pattern, and a tunnel barrier between the reference magnetic structure and the free magnetic pattern. The reference magnetic structure consists of one SAF structure, a polarization reinforcement magnetic pattern, and a nonmagnetic pattern between the one SAF structure and the polarization reinforcement magnetic pattern. The one SAF structure includes: a first fixed pattern including cobalt (Co) and in contact with an upper surface of the seed pattern; an antiferromagnetic coupling pattern in contact with an upper surface of the first fixed pattern; and a second fixed pattern including Co and having a lower surface in contact with an upper surface of the antiferromagnetic coupling pattern and an upper surface in contact with a lower surface of the nonmagnetic pattern.

According to another aspect of the inventive concept, a magnetic device includes: a first electrode and a second electrode on a substrate and separated from each other in a vertical direction; and a seed pattern and a MTJ structure sequentially stacked in the vertical direction between the first electrode and the second electrode. The MTJ structure includes a reference magnetic structure, a free magnetic pattern, and a tunnel barrier between the reference magnetic structure and the free magnetic pattern. The reference magnetic structure consists of one SAF structure, a polarization reinforcement magnetic pattern, and a nonmagnetic pattern between the one SAF structure and the polarization reinforcement magnetic pattern. The one SAF structure includes: a first fixed pattern including Co and in contact with an upper surface of the seed pattern; an antiferromagnetic coupling pattern including an iridium (Ir) layer and in contact with an upper surface of the first fixed pattern; and a second fixed pattern including Co and having a lower surface in contact with an upper surface of the antiferromagnetic coupling pattern and an upper surface in contact with a lower surface the nonmagnetic pattern.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Figure 1:
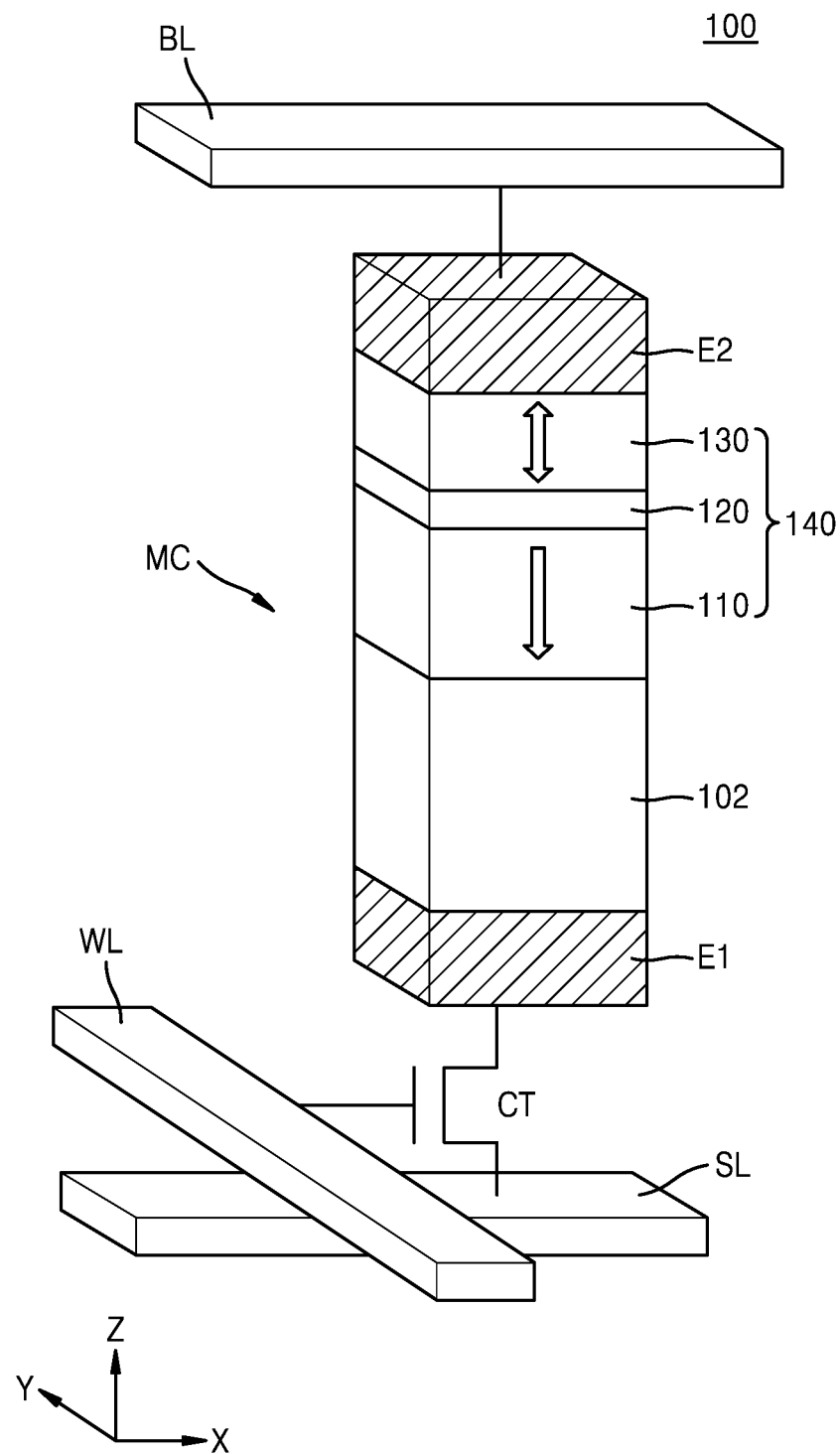
FIG. 1 is a perspective view illustrating a magnetic device according to embodiments of the inventive concept.

Hereinafter, embodiments of the inventive concept are described in detail with reference to the accompanying drawings. Like reference numerals in the drawings denote like elements, and thus, their repetitive description will be omitted.

FIG. 1 is a perspective view illustrating a magnetic device 100 according to embodiments of the inventive concept. FIG. 1 illustrates the magnetic device 100 including spin transfer torque-magnetoresistive random access memory (STT-MRAM).

The magnetic device 100 may include a memory cell MC. The memory cell MC may include a first electrode E1 and a second electrode E2 separated from each other in a vertical direction (a Z direction), and a seed pattern 102 and a magnetic tunnel junction (MTJ) structure 140 between the first electrode E1 and the second electrode E2 and sequentially stacked on the first electrode E1 in the vertical direction (the Z direction). The MTJ structure 140 may be connected to a cell transistor CT via the first electrode E1. A gate of the cell transistor CT may be connected to a word line WL, one electrode of the cell transistor CT may be connected to a bit line BL via the MTJ structure 140, and the other electrode of the cell transistor CT may be connected to a source line SL.

The MTJ structure 140 may include a reference magnetic structure 110, a tunnel barrier 120, and a free magnetic pattern 130 sequentially disposed in the vertical direction (the Z direction). The tunnel barrier 120 may be between the reference magnetic structure 110 and the free magnetic pattern 130. The reference magnetic structure 110 may have a magnetization easy axis in the vertical direction (the Z direction) and may have a fixed magnetization direction. The free magnetic pattern 130 may have the magnetization easy axis in the vertical direction (the Z direction) and may have a magnetization direction that is variable according to conditions. The arrangement of the reference magnetic structure 110 and the free magnetic pattern 130 is not limited to that shown in FIG. 1, and respective positions of the reference magnetic structure 110 and the free magnetic pattern 130 may be exchanged with each other.

A resistance value of the MTJ structure 140 may vary depending on magnetization directions in the free magnetic pattern 130 and the reference magnetic structure 110 relative to one another. When the magnetization direction of the free magnetic pattern 130 is parallel to the magnetization direction of the reference magnetic structure 110, the MTJ structure 140 may have a low resistance value and store data '0'. When the magnetization direction of the free magnetic pattern 130 is antiparallel to the magnetization direction of the reference magnetic structure 110, the MTJ structure 140 may have a high resistance value and store data '1'.

A unidirectional arrow marked in the reference magnetic structure 110 indicates that the reference magnetic structure 110 has fixed magnetization, and a bidirectional arrow marked in the free magnetic pattern 130 indicates that the free magnetic pattern 130 is magnetized in parallel or antiparallel to the magnetization direction of the reference magnetic structure 110. The magnetization direction of the free magnetic pattern 130 may be changed by controlling a direction of a tunneling current having a spin torque in the MTJ structure 140.

In the magnetic device 100 shown in FIG. 1, for a write operation on the STT-MRAM, a logic-high voltage may be applied to the word line WL to turn the cell transistor CT on, and a write current may be applied between the bit line BL and the source line SL. In this case, the magnetization direction of the free magnetic pattern 130 may be determined according to a direction of the write current. In the MTJ structure 140, the magnetization direction of the free magnetic pattern 130 may be changed by an STT.

In the magnetic device 100, for a read operation on the STT-MRAM, a logic-high voltage may be applied to the word line WL to turn the cell transistor CT on, and a read current may be applied in a direction from the bit line BL to the source line SL to read data stored in the MTJ structure 140. In this case, because a strength of the read current is much less than a strength of the write current, the magnetization direction of the free magnetic pattern 130 may not be changed by the read current.

Figure 2:
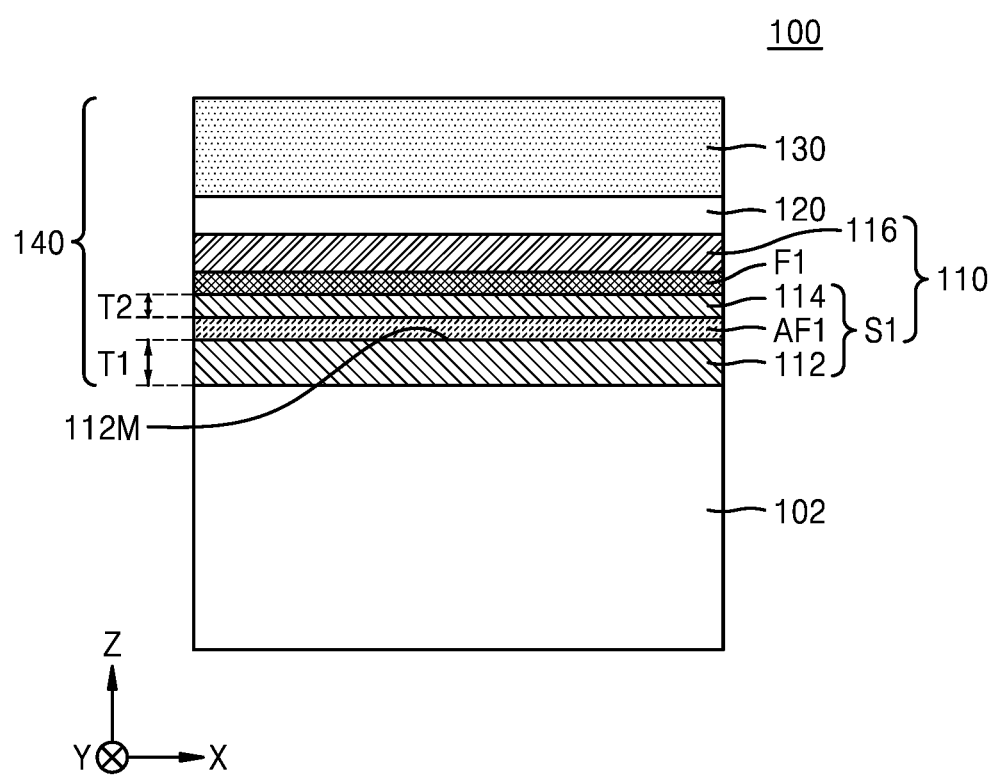
FIG. 2 is a cross-sectional view illustrating in more detail the magnetic device shown in FIG. 1.

FIG. 2 is a cross-sectional view illustrating in more detail the magnetic device 100 shown in FIG. 1.

Referring to FIG. 2, the MTJ structure 140 in the magnetic device 100 may include the reference magnetic structure 110, the free magnetic pattern 130, and the tunnel barrier 120 between the reference magnetic structure 110 and the free magnetic pattern 130.

The reference magnetic structure 110 may include a synthetic antiferromagnetic (SAF) structure S1, a nonmagnetic pattern F1, and a polarization reinforcement magnetic pattern 116 sequentially stacked on the seed pattern 102 in the vertical direction (the Z direction).

The SAF structure S1 may include a first fixed pattern 112, an antiferromagnetic coupling pattern AF1, and a second fixed pattern 114 sequentially stacked on the seed pattern 102 in the vertical direction (the Z direction).

The SAF structure S1 may consist of one first fixed pattern 112, one antiferromagnetic coupling pattern AF1, and one second fixed pattern 114. The reference magnetic structure 110 may consist of one SAF structure S1, one nonmagnetic pattern F1, and one polarization reinforcement magnetic pattern 116. That is, the SAF structure S1 may include only the first fixed pattern 112, the antiferromagnetic coupling pattern AF1, and the second fixed pattern 114, and may be free of other or intervening layers or patterns. Similarly, the reference magnetic structure 110 may include only the SAF structure S1, the nonmagnetic pattern F1, and the polarization reinforcement magnetic pattern 116, free of other or intervening layers or patterns.

In the SAF structure S1, the first fixed pattern 112 may have a lower surface in contact with the seed pattern 102 and an upper surface in contact with a lower surface of the antiferromagnetic coupling pattern AF1. The antiferromagnetic coupling pattern AF1 may have the lower surface in contact with the upper surface of the first fixed pattern 112 and an upper surface in contact with a lower surface of the second fixed pattern 114. The second fixed pattern 114 may have the lower surface in contact with the upper surface of the antiferromagnetic coupling pattern AF1 and an upper surface in contact with a lower surface of the nonmagnetic pattern F1. Elements or layers described as "on" or "in contact with" other elements or layers may be directly on or in direct contact with the other elements or layers, or intervening elements or layers may be present. In contrast, when elements or layers are described as "on" or "in contact with" other elements or layers, no intervening elements or layers may be present.

The nonmagnetic pattern F1 may have the lower surface in contact with the upper surface of the second fixed pattern 114 and an upper surface in contact with a lower surface of the polarization reinforcement magnetic pattern 116. The polarization reinforcement magnetic pattern 116 may have the lower surface in contact with the upper surface of the nonmagnetic pattern F1 and an upper surface in contact with a lower surface of the tunnel barrier 120. In the SAF structure S1, the first fixed pattern 112 may be configured to have a fixed magnetization direction that is a direction (the Z direction of FIG. 2) perpendicular to a main surface 112M of the first fixed pattern 112. In the vertical direction (the Z direction), a first thickness T1 of the first fixed pattern 112 may be greater than a second thickness T2 of the second fixed pattern 114. In example embodiments, the second thickness T2 may be greater than about ⅓ of the first thickness T1 and less than or equal to about ½ of the first thickness T1. In example embodiments, in the SAF structure S1, a thickness of each of the antiferromagnetic coupling pattern AF1 and the second fixed pattern 114 may be less than the first thickness T1 of the first fixed pattern 112. For example, the first fixed pattern 112 may have a thickness of about 7 Å to about 15 Å in the vertical direction (the Z direction), and each of the antiferromagnetic coupling pattern AF1 and the second fixed pattern 114 may have a thickness of about 3 Å to about 7 Å in the vertical direction (the Z direction), but the present embodiment is not limited thereto.

In example embodiments, in the SAF structure S1, each of the first fixed pattern 112 and the second fixed pattern 114 may include cobalt (Co). For example, each of the first fixed pattern 112 and the second fixed pattern 114 may include Co, cobalt platinum (CoPt), cobalt palladium (CoPd), or a combination thereof. As another example, each of the first fixed pattern 112 and the second fixed pattern 114 may include a single layer including Co. As another example, any one of the first fixed pattern 112 or the second fixed pattern 114 may include CoPt, CoPd, or a combination thereof, and the other one of the first fixed pattern 112 and the second fixed pattern 114 may include a single layer including Co.

In the SAF structure S1, the antiferromagnetic coupling pattern AF1 may include a nonmagnetic material having an antiferromagnetic coupling characteristic. In example embodiments, the antiferromagnetic coupling pattern AF1 may include a single layer including iridium (Ir). In other example embodiments, the antiferromagnetic coupling pattern AF1 may include Ir, ruthenium (Ru), rhenium (Re), rhodium (Rh), tellurium (Te), yttrium (Y), chromium (Cr), silver (Ag), copper (Cu), or a combination thereof.

The first fixed pattern 112 and the second fixed pattern 114 may be antiferromagnetically coupled to each other by the antiferromagnetic coupling pattern AF1. The antiferromagnetic coupling pattern AF1 may couple the first fixed pattern 112 to the second fixed pattern 114 so that the magnetization direction of the first fixed pattern 112 is antiparallel to a magnetization direction of the second fixed pattern 114. Accordingly, the magnetization direction of the first fixed pattern 112 may be fixed to a direction antiparallel to the magnetization direction of the second fixed pattern 114.

The antiferromagnetic coupling pattern AF1 may have a desired or optimal thickness for inducing antiferromagnetic coupling between the first fixed pattern 112 and the second fixed pattern 114. For example, the antiferromagnetic coupling pattern AF1 may have a thickness of about 4 Å to about 5 Å in the vertical direction (the Z direction) but is not limited thereto.

The first fixed pattern 112 included in the SAF structure S1 may have a perpendicular magnetization characteristic by magnetic anisotropy induced by the lower surface of the first fixed pattern 112 being in contact with the seed pattern 102 and the upper surface of the first fixed pattern 112 being in contact with the antiferromagnetic coupling pattern AF1 along respective interfaces.

The seed pattern 102 may include a material having a lattice structure favorable for crystal growth of the first fixed pattern 112. In example embodiments, the seed pattern 102 may include a material selected from among tantalum (Ta), Ru, Ir, Cr, Pt, or an alloy thereof, and the top layer of the seed pattern 102 in contact with the lower surface the first fixed pattern 112 may include an Ir layer.

In example embodiments, at least a portion of the seed pattern 102 may include a conductive material having the same lattice structure as that of the first fixed pattern 112. For example, the top layer of the seed pattern 102 may include an Ir layer, and each of the top layer of the seed pattern 102 and the first fixed pattern 112 may have a face centered cubic (FCC) lattice structure.

In example embodiments, the Ir layer forming the top layer of the seed pattern 102 may improve perpendicular magnetic anisotropy (PMA) of the first fixed pattern 112 by maintaining <111> orientation of the FCC lattice structure in a crystal structure of the first fixed pattern 112 including Co at or along the interface between the top layer of the seed pattern 102 and the lower surface of the first fixed pattern 112.

In example embodiments, a thickness of the seed pattern 102 in the vertical direction (the Z direction) may be greater than a thickness of the reference magnetic structure 110 in the vertical direction (the Z direction). In example embodiments, a thickness of the Ir layer forming the top layer of the seed pattern 102 in the vertical direction (the Z direction) may be greater than the first thickness T1 of the first fixed pattern 112 in contact with the Ir layer.

In example embodiments, the seed pattern 102 may have a thickness of at least 50 Å, e.g., at least 60 Å.

As shown in FIG. 2, the lower surface of the nonmagnetic pattern F1 may be in contact with the upper surface of the second fixed pattern 114. The upper surface of the nonmagnetic pattern F1 may be in contact with the lower surface of the polarization reinforcement magnetic pattern 116. The polarization reinforcement magnetic pattern 116 may be configured to be ferromagnetically coupled to the SAF structure S1 by the nonmagnetic pattern F1.

The nonmagnetic pattern F1 may include a nonmagnetic material having the ferromagnetic coupling characteristic. The nonmagnetic pattern F1 may include a nonmagnetic element, a nonmagnetic compound, or a nonmagnetic alloy. In example embodiments, the nonmagnetic pattern F1 may include molybdenum (Mo), Ta, tungsten (W), niobium (Nb), vanadium (V), Pt, Ir, aluminum (Al), hafnium (Hf), Cr, Ru, zirconium (Zr), Pd, carbon (C), boron (B), oxygen (O), nitrogen (N), or a combination thereof but is not limited thereto.

The polarization reinforcement magnetic pattern 116 may be ferromagnetically coupled to the second fixed pattern 114 by the nonmagnetic pattern F1. The nonmagnetic pattern F1 may couple the polarization reinforcement magnetic pattern 116 to the second fixed pattern 114 so that a magnetization direction of the polarization reinforcement magnetic pattern 116 is parallel to the magnetization direction of the second fixed pattern 114. Accordingly, the magnetization direction of the polarization reinforcement magnetic pattern 116 may be fixed to be parallel to magnetization direction of the second fixed pattern 114.

The polarization reinforcement magnetic pattern 116 may have the lower surface in contact with the upper surface of the nonmagnetic pattern F1 and the upper surface in contact with the tunnel barrier 120. The polarization reinforcement magnetic pattern 116 may have the perpendicular magnetization characteristic by magnetic anisotropy induced by the junction of the tunnel barrier 120 and the polarization reinforcement magnetic pattern 116. The magnetization direction of the polarization reinforcement magnetic pattern 116 may be a direction perpendicular to an interface between the tunnel barrier 120 and the free magnetic pattern 130.

In example embodiments, the polarization reinforcement magnetic pattern 116 may have a body centered cubic (BCC) lattice structure but is not limited thereto. The polarization reinforcement magnetic pattern 116 may include a magnetic material having a high magnetoresistance ratio by being in contact with the tunnel barrier 120. For example, the polarization reinforcement magnetic pattern 116 may include at least one element selected from among Co, iron (Fe), or nickel (Ni) and at least one element selected from among B, silicon (Si), Zr, Hf, beryllium (Be), Al, C, Mo, Ta, or Cu. For example, the polarization reinforcement magnetic pattern 116 may include CoFeB but is not limited thereto.

Referring to FIGS. 1 and 2, the tunnel barrier 120 may include an oxide of any one material selected from among magnesium (Mg), titanium (Ti), Al, magnesium zinc (MgZn), and MgB, a Ti nitride, a V nitride, or a combination thereof. For example, the tunnel barrier 120 may include a magnesium oxide (MgO), an aluminum oxide (AlO), a magnesium aluminum oxide (MgAlO), or a combination thereof. The tunnel barrier 120 may have an FCC lattice structure. The tunnel barrier 120 may have a thickness of about 5 Å to about 15 Å but is not limited thereto.

A lower surface of the free magnetic pattern 130 may be in contact with an upper surface of the tunnel barrier 120 The free magnetic pattern 130 may include a magnetic material having the perpendicular magnetization characteristic by magnetic anisotropy induced by the junction of the tunnel barrier 120 and the free magnetic pattern 130. In example embodiments, the free magnetic pattern 130 may include an Fe layer, a CoFeB layer, a CoFeNiB layer, or a combination thereof.

The magnetization direction of the free magnetic pattern 130 may be parallel or antiparallel to the magnetization direction of the polarization reinforcement magnetic pattern 116. When the magnetization direction of the polarization reinforcement magnetic pattern 116 is parallel to the magnetization direction of the free magnetic pattern 130, the MTJ structure 140 may have a low resistance value. When the magnetization direction of the polarization reinforcement magnetic pattern 116 is antiparallel to the magnetization direction of the free magnetic pattern 130, the MTJ structure 140 may have a high resistance value.

The free magnetic pattern 130 may be relatively thin to maintain relatively strong PMA. For example, the free magnetic pattern 130 may have a thickness of about 5 Å to about 15 Å but is not limited thereto.

Referring to FIG. 1, each of the first electrode E1 and the second electrode E2 may include a metal, a conductive metal nitride, doped polysilicon, or a combination thereof. For example, each of the first electrode E1 and the second electrode E2 may include Ru, Ta, Ti, Pt, W, a titanium nitride (TiN), a tantalum nitride (TaN), Al, Co, Ni, Cu, doped polysilicon, or a combination thereof.

Figure 3:
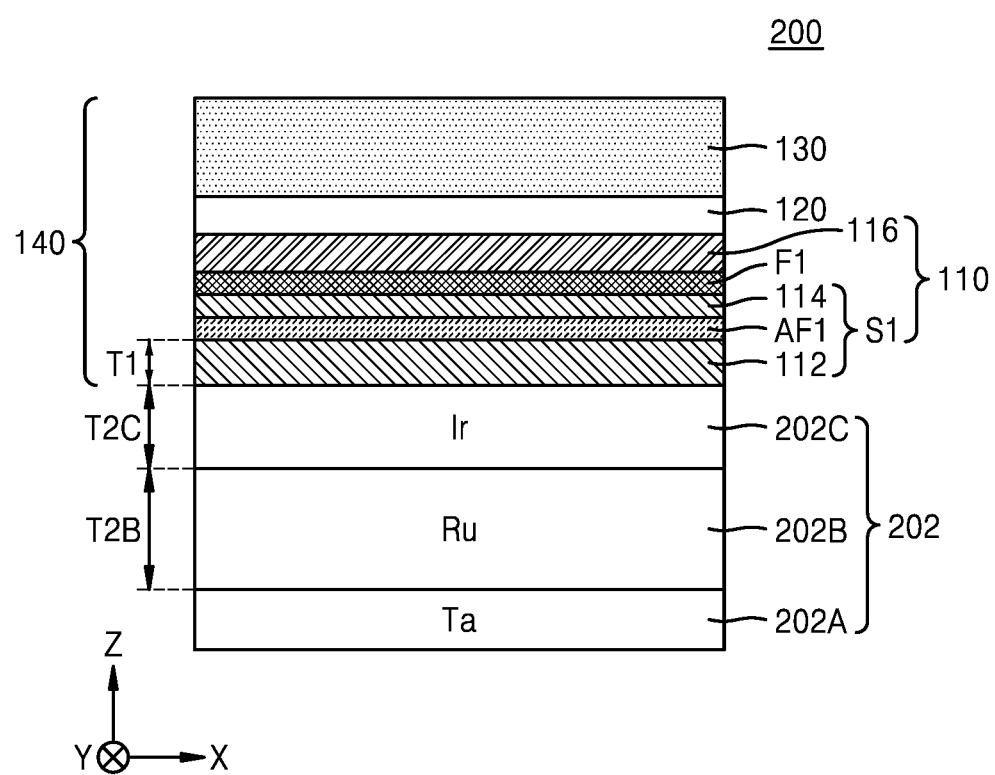
FIG. 3 is a cross-sectional view illustrating a magnetic device according to further embodiments of the inventive concept.

FIG. 3 is a cross-sectional view illustrating a magnetic device 200 according to further embodiments of the inventive concept.

Referring to FIG. 3, the magnetic device 200 may have generally the same configuration as the magnetic device 100 described with reference to FIGS. 1 and 2. However, the magnetic device 200 may include a seed pattern 202 in contact with the first fixed pattern 112.

The seed pattern 202 may have generally the same configuration as the seed pattern 102 described with reference to FIGS. 1 and 2. However, the seed pattern 202 may include a triple layer including a Ta layer 202A, an Ru layer 202B, and an Ir layer 202C sequentially stacked on the first electrode E1 (see FIG. 1). The Ir layer 202C forms the top layer of the seed pattern 202 and may be in contact with the lower surface of the first fixed pattern 112. The Ru layer 202B may be separated from the first fixed pattern 112 with the Ir layer 202C therebetween.

In example embodiments, a thickness of the seed pattern 202 in the vertical direction (the Z direction) may be greater than the thickness of the reference magnetic structure 110 in the vertical direction (the Z direction). In example embodiments, the seed pattern 202 may have a thickness of at least 50 Å, e.g., at least 60 Å. In example embodiments, a thickness T2C of the Ir layer 202C that is the top layer of the seed pattern 202 in the vertical direction (the Z direction) may be greater than the first thickness T1 of the first fixed pattern 112.

In the seed pattern 202, a thickness T2B of the Ru layer 202B among the Ta layer 202A, the Ru layer 202B, and the Ir layer 202C may be the greatest. The Ru layer 202B may have a hexagonal close-packed (HCP) lattice structure, and the Ir layer 202C may have an FCC lattice structure. <001> orientation of the HCP lattice structure forming the Ru layer 202B and <111> orientation of the FCC lattice structure forming the Ir layer 202C may be similar with respect to providing a dense structure, and accordingly, the <111> orientation of the FCC lattice structure may be well grown on the <001> orientation of the HCP lattice structure.

In the seed pattern 202, each of the Ir layer 202C and the first fixed pattern 112 may have an FCC lattice structure, and in this case, when the first fixed pattern 112 is formed, the first fixed pattern 112 may be grown along the <111> orientation of the FCC lattice structure in a state in which lattice mismatch on the Ir layer 202C is reduced or minimized, so that the <111> orientation is maintained over the thickness T1 of the first fixed pattern 112. Therefore, the first fixed pattern 112 may maintain very strong PMA. Therefore, the performance of the magnetic device 200 may be improved.

In addition, because the Ir layer 202C that is the top layer of the seed pattern 202 is immediately beneath the first fixed pattern 112 and in contact with the lower surface of the first fixed pattern 112, a grain structure forming the first fixed pattern 112 and the reference magnetic structure 110 including the first fixed pattern 112 may be improved, and surface roughness may be reduced. Therefore, the performance of the reference magnetic structure 110 may be improved.

Figure 4:
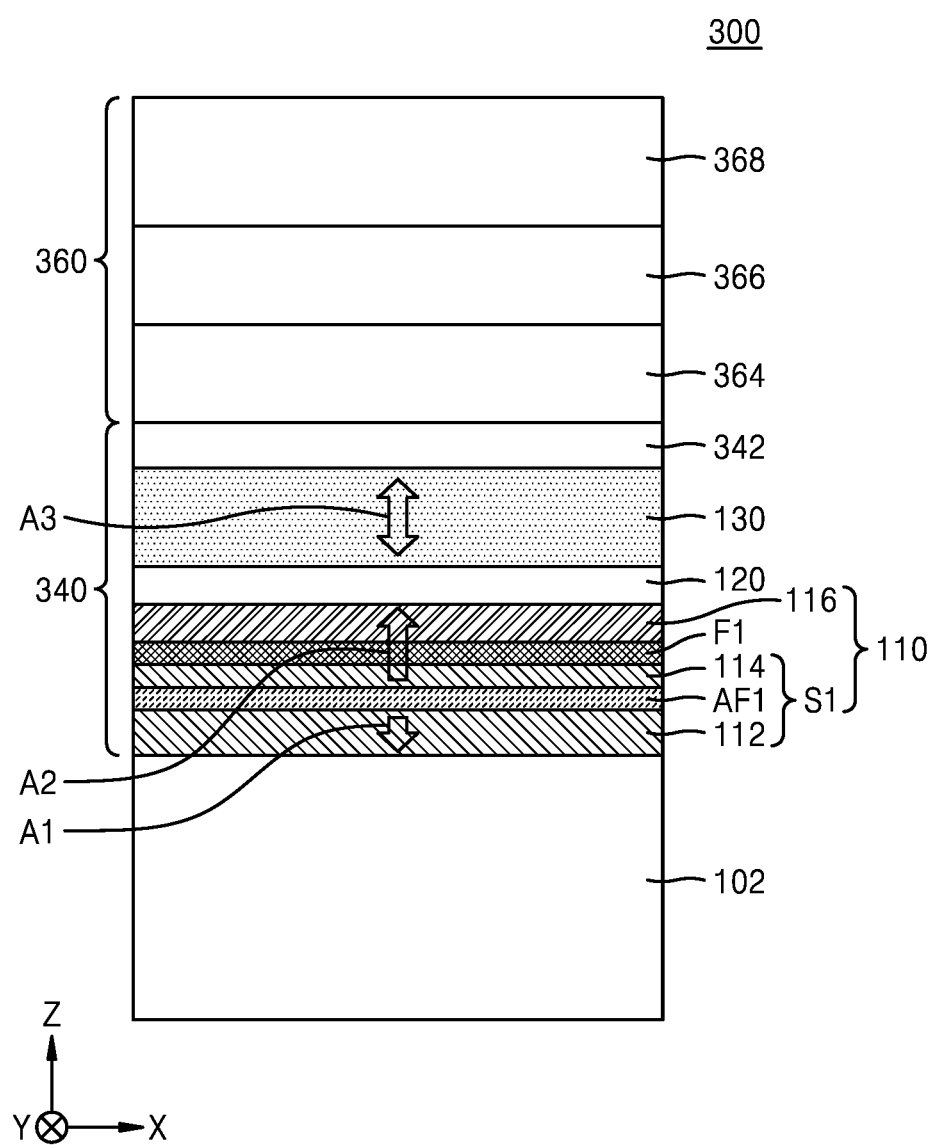
FIG. 4 is a cross-sectional view illustrating a magnetic device according to further embodiments of the inventive concept.

FIG. 4 is a cross-sectional view illustrating a magnetic device 300 according to further embodiments of the inventive concept.

Referring to FIG. 4, the magnetic device 300 may have generally the same configuration as the magnetic device 100 described with reference to FIGS. 1 and 2. However, the magnetic device 300 includes an MTJ structure 340. The MTJ structure 340 may have generally the same configuration as the MTJ structure 140 described with reference to FIGS. 1 and 2. However, the MTJ structure 340 further includes a metal oxide capping pattern 342 in contact with an upper surface of the free magnetic pattern 130.

The metal oxide capping pattern 342 may be at the top of the MTJ structure 340. The metal oxide capping pattern 342 may be configured to provide strong PMA along an interface between the free magnetic pattern 130 and the metal oxide capping pattern 342.

The free magnetic pattern 130 has a structure between and coming in contact with the tunnel barrier 120 and the metal oxide capping pattern 342. Therefore, the free magnetic pattern 130 may have relatively strong PMA by magnetic anisotropy induced from each of an interface between the free magnetic pattern 130 and the tunnel barrier 120 and the interface between the free magnetic pattern 130 and the metal oxide capping pattern 342. FIG. 4 shows magnetization directions A1, A2, and A3 in the reference magnetic structure 110 and the free magnetic pattern 130.

In example embodiments, the metal oxide capping pattern 342 may include MgO, tantalum oxide (TaO), AlO, manganese oxide (MnO), vanadium oxide (VO), boron oxide (BO), magnesium tantalum oxide (MgTaO), strontium titanium oxide (SrTiO), barium titanium oxide (BaTiO), calcium titanium oxide (CaTiO), lanthanum aluminum oxide (LaAlO), or a combination thereof. In example embodiments, the tunnel barrier 120 and the metal oxide capping pattern 342 may include the same material. The metal oxide capping pattern 342 may have a thickness of about 5 Å to about 15 Å but is not limited thereto.

A conductive capping structure 360 may cover an upper surface of the metal oxide capping pattern 342. The conductive capping structure 360 may include Ru, Ta, Ti, Pt, W, TiN, TaN, Al, Co, Ni, Cu, doped polysilicon, or a combination thereof. The conductive capping structure 360 may form the second electrode E2 shown in FIG. 1.

In example embodiments, the conductive capping structure 360 may have a multi-layer structure including a plurality of metal layers. As shown in FIG. 4, the conductive capping structure 360 may include a first conductive capping pattern 364 in contact with the upper surface of the metal oxide capping pattern 342, and a second conductive capping pattern 366 and a third conductive capping pattern 368 sequentially stacked on the first conductive capping pattern 364. In example embodiments, each of the first conductive capping pattern 364 and the third conductive capping pattern 368 may include an Ru layer, and the second conductive capping pattern 366 may include a Ta layer. However, a structure of the conductive capping structure 360 is not limited to that shown in FIG. 4 and may be variously modified or changed within the scope of the inventive concept.

Figure 5:
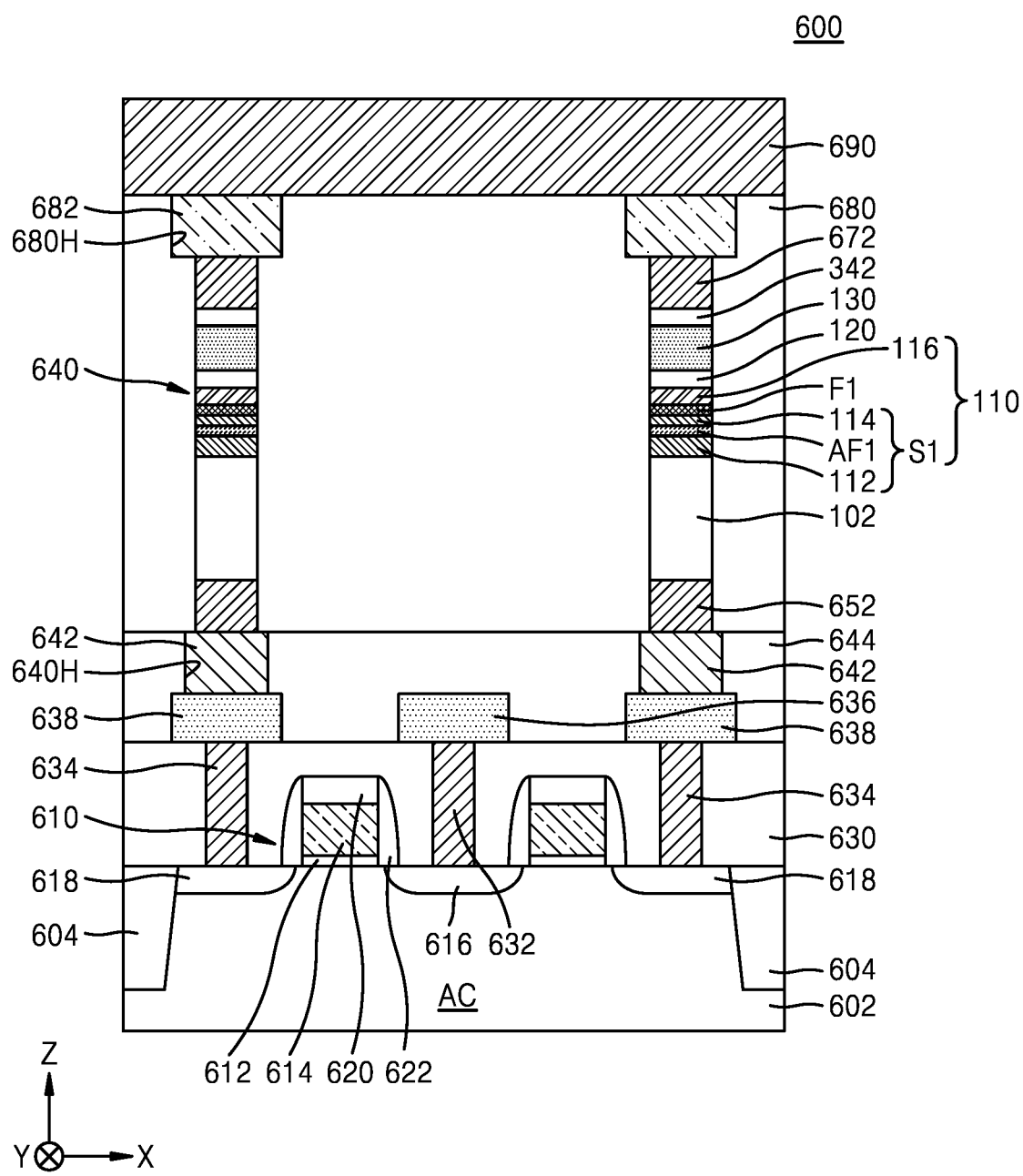
FIG. 5 is a cross-sectional view illustrating a magnetic device according to further embodiments of the inventive concept.

FIG. 5 is a cross-sectional view illustrating a magnetic device 600 according to further embodiments of the inventive concept. In FIG. 5, like reference numerals in FIGS. 1 to 4 denote like members, and thus, a detailed description thereof is omitted herein.

Referring to FIG. 5, the magnetic device 600 includes a substrate 602 including an active area AC defined by a device isolation layer 604 and a plurality of transistors 610 formed on the active area AC of the substrate 602.

The substrate 602 may be formed by a semiconductor wafer. The substrate 602 may include a semiconductor element such as Si or germanium (Ge) or a compound semiconductor such as silicon carbide (SiC), gallium arsenide (GaAs), indium arsenide (InAs), or indium phosphide (InP). In other example embodiments, the substrate 602 may have a silicon on insulator (SOI) structure. The substrate 602 may include a conductive area, e.g., an impurity-doped well or an impurity-doped structure. The device isolation layer 604 may have a shallow trench isolation (STI) structure.

Each transistor 610 may include a gate insulating layer 612, a gate electrode 614, a source region 616, and a drain region 618. An upper surface of the gate electrode 614 may be covered by an insulating capping pattern 620, and both side walls thereof may be covered by an insulating spacer 622.

A first interlayer insulating layer 630 covering the plurality of transistors 610 may be on the substrate 602, and a source line 636 and a plurality of conductive patterns 638 may be on the first interlayer insulating layer 630. The source line 636 may be connected to the source region 616 of the transistor 610 via a first contact plug 632 passing through the first interlayer insulating layer 630. Each of the plurality of conductive patterns 638 may be connected to the drain region 618 of the transistor 610 via a second contact plug 634 passing through the first interlayer insulating layer 630. Each of the first contact plug 632 and the second contact plug 634 may include a metal, a conductive metal nitride, impurity-doped polysilicon, or a combination thereof. Each of the source line 636 and the plurality of conductive patterns 638 may include a metal, a conductive metal nitride, or a combination thereof.

The source line 636 and the plurality of conductive patterns 638 may be covered by a second interlayer insulating layer 644. A plurality of lower electrode contact plugs 642 passing through the second interlayer insulating layer 644 may be respectively on the plurality of conductive patterns 638. Each of the plurality of lower electrode contact plugs 642 may include a metal, a conductive metal nitride, impurity-doped polysilicon, or a combination thereof.

A lower electrode 652, an MTJ structure 640, and a conductive mask pattern 672 may be sequentially stacked on an upper surface of each of the plurality of lower electrode contact plugs 642 in the vertical direction (the Z direction). The lower electrode 652 may include a metal, a conductive metal nitride, doped polysilicon, or a combination thereof. For example, the lower electrode 652 may include TaN but is not limited thereto. The MTJ structure 640 may have the same structure as the MTJ structure 140 described with reference to FIGS. 1 and 2. The conductive mask pattern 672 may include a metal or a conductive metal nitride. In example embodiments, each of a plurality of conductive mask patterns 672 may include Ru, Ta, Ti, Pt, W, TiN, TaN, Al, Co, Ni, Cu, doped polysilicon, or a combination thereof. In example embodiments, each of the plurality of conductive mask patterns 672 may include the same stack structure as the conductive capping structure 360 described with reference to FIG. 4.

A third interlayer insulating layer 680 may be on the second interlayer insulating layer 644. The third interlayer insulating layer 680 may cover a plurality of lower electrodes 652, a plurality of MTJ structures 640, and the plurality of conductive mask patterns 672. Each of the first interlayer insulating layer 630, the second interlayer insulating layer 644, and the third interlayer insulating layer 680 may include a silicon oxide layer, a silicon nitride layer, or a combination thereof.

A bit line 690 may be on the third interlayer insulating layer 680. A plurality of bit line contact holes 680H passing through a portion of an upper side of the third interlayer insulating layer 680 may be formed in the third interlayer insulating layer 680. The plurality of bit line contact holes 680H may be respectively filled with a plurality of bit line contact plugs 682. The plurality of conductive mask patterns 672 respectively connected to the plurality of MTJ structures 640 may be connected to the bit line 690 via the plurality of bit line contact plugs 682. Each of the plurality of bit line contact plugs 682 and the bit line 690 may include a metal, a conductive metal nitride, or a combination thereof.

In example embodiments, the seed pattern 102 included in the magnetic device 600 may be replaced with the seed pattern 202 described with reference to FIG. 3.

According to the magnetic devices 100, 200, 300, and 600 described with reference to FIGS. 1 to 5, the reference magnetic structure 110 included in the MTJ structure 140, 340, or 640 may not employ a structure including a plurality of consecutive or repeating SAF structures but rather includes only one SAF structure S1. Herein, the SAF structure S1 may consist of one first fixed pattern 112, one antiferromagnetic coupling pattern AF1, and one second fixed pattern 114 in a non-repeating structure. Therefore, an ultrathin SAF structure S1 having a very little thickness in the vertical direction (the Z direction) may be implemented. In addition, the magnetic devices 100, 200, 300, and 600 may employ the simplified SAF structure S1 to simplify a manufacturing process, and in an anisotropic etching process for forming the MTJ structure 140, 340, or 640 including the SAF structure S1, an amount of metal-containing materials undesirably redeposited on side walls of the MTJ structure 140, 340, or 640 may be significantly reduced, thereby making relatively easy a process of manufacturing the magnetic device 100, 200, 300, or 600. In addition, by simplifying the SAF structure S1 and reducing the thickness of the reference magnetic structure 110 in the vertical direction (the Z direction), a magnetic moment of a local in-plane magnetic anisotropy component applied from the SAF structure S1 to the free magnetic pattern 130 may be reduced or minimized, thereby improving a data retention characteristic and reducing the surface roughness of a cross-section of the MTJ structure 140, 340, or 640 in the vertical direction (the Z direction).

In addition, even when performing a process accompanied by heat in a process of manufacturing the magnetic device 100, 200, 300, or 600, unlike a common magnetic device having a structure including a plurality of SAF structures, the thermal stability of the MTJ structure 140, 340, or 640 may be improved because of an effect of a very low magnetic moment. Therefore, because a heat-resistance characteristic is excellent, stable PMA may be maintained even at a relatively high temperature, and accordingly, thermal stability required for high integration of a magnetic device may be improved, thereby providing a magnetic device having an excellent data retention characteristic and improved reliability.

FIGS. 6A to 6J are cross-sectional views illustrated in a process sequence to describe a magnetic device manufacturing method according to embodiments of the inventive concept. A method of manufacturing the magnetic device 600 shown in FIG. 5 is described with reference to FIGS. 6A to 6J. In FIGS. 6A to 6J, like reference numerals in FIGS. 1 to 5 denote like members or elements, and thus, a detailed description thereof is omitted herein.

Figure 6A:
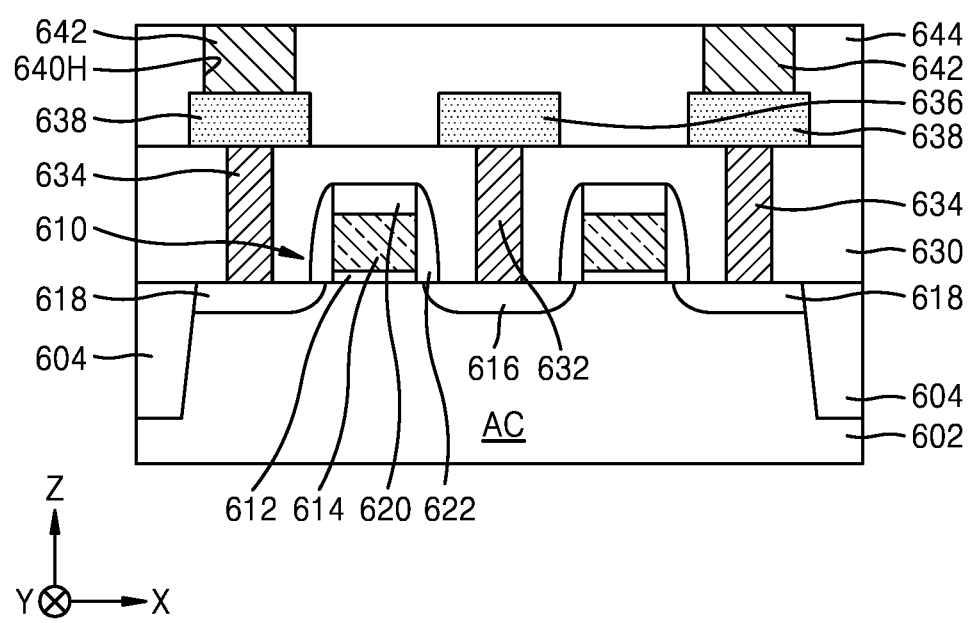
FIGS. 6A, 6B, 6C, 6D, 6E, 6F, 6G, 6H, 6I, and 6J are cross-sectional views illustrated in a process sequence to describe a magnetic device manufacturing method according to embodiments of the inventive concept.

Referring to FIG. 6A, the device isolation layer 604 may be formed on the substrate 602 to define the active area AC, and the transistor 610 may be formed on the active area AC.

A first interlayer insulating layer 630, which is planarized and covers the transistor 610, may be formed on the substrate 602, and the first contact plug 632 electrically connected to the source region 616 by passing through the first interlayer insulating layer 630 and the second contact plug 634 electrically connected to the drain region 618 by passing through the first interlayer insulating layer 630 may be formed. A conductive layer may be formed on the first interlayer insulating layer 630 and then patterned to form the source line 636 and the plurality of conductive patterns 638.

Thereafter, the second interlayer insulating layer 644 covering the source line 636 and the plurality of conductive patterns 638 on the first interlayer insulating layer 630 may be formed. A plurality of lower electrode contact holes 640H exposing upper surfaces of the plurality of conductive patterns 638 may be formed by using a photolithography process to partially remove the second interlayer insulating layer 644. The plurality of lower electrode contact holes 640H may be filled with a conductive material, and the plurality of lower electrode contact plugs 642 may be formed by polishing the conductive material so that an upper surface of the second interlayer insulating layer 644 is exposed.

Figure 6B:
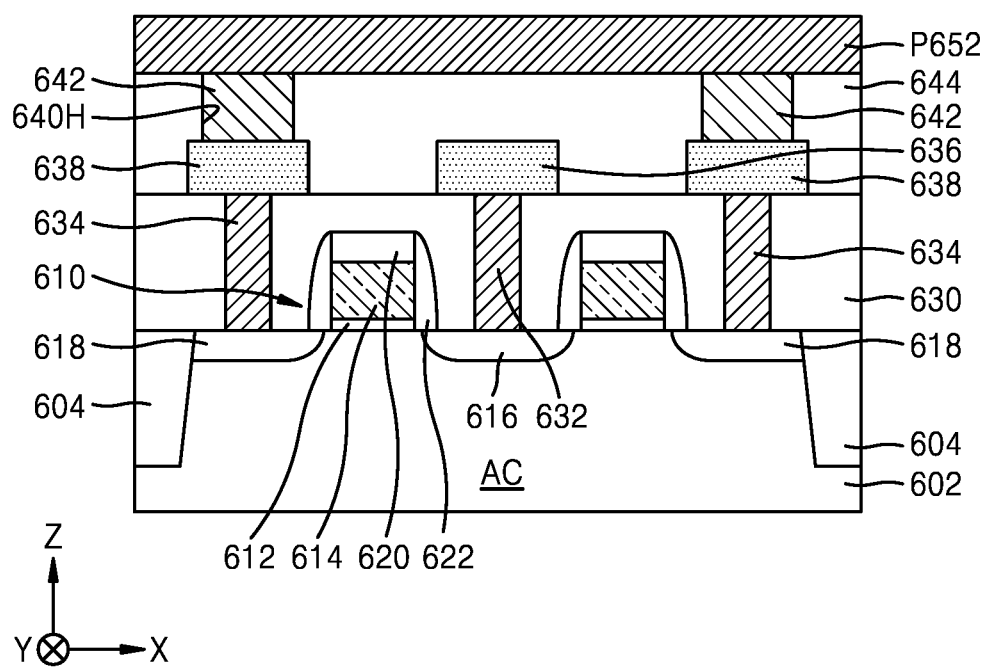

Referring to FIG. 6B, a lower electrode layer P652 may be formed on the second interlayer insulating layer 644 and the plurality of lower electrode contact plugs 642.

In example embodiments, to form the lower electrode layer P652, a chemical vapor deposition (CVD), physical vapor deposition (PVD), atomic layer deposition (ALD), or reactive pulsed laser deposition (PLD) process may be used. A more detailed description of a constituent material of the lower electrode layer P652 is the same as made with respect to the first electrode E1 with reference to FIG. 2.

Figure 6C:
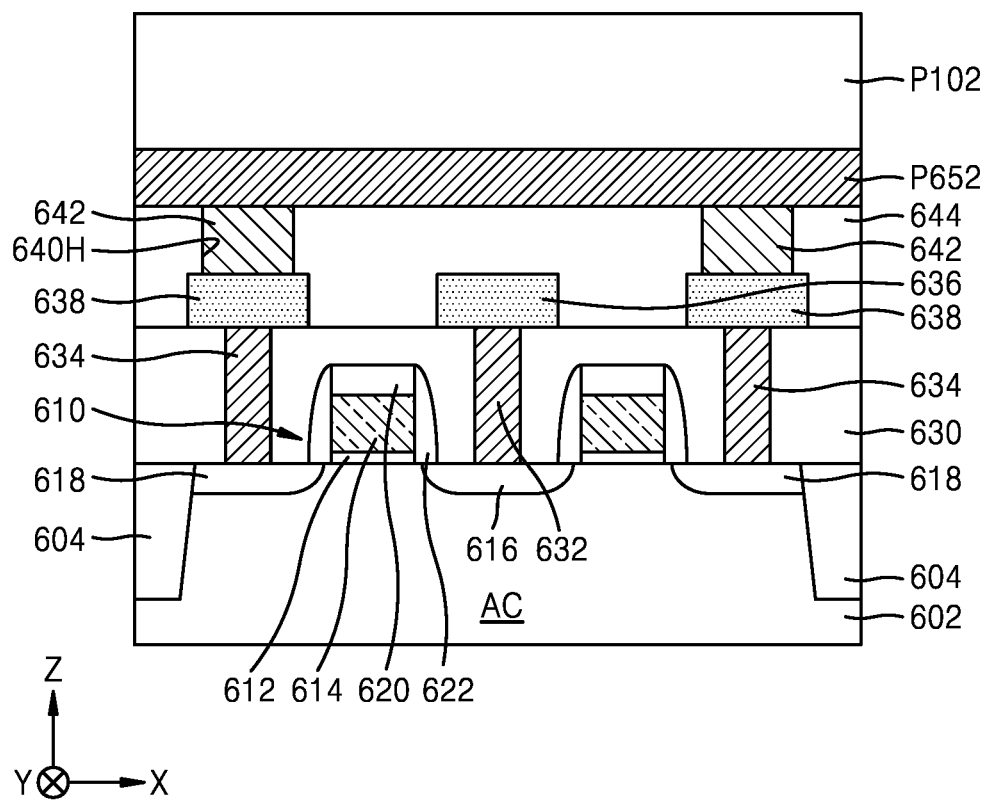

Referring to FIG. 6C, a seed layer P102 is formed on the lower electrode layer P652. The seed layer P102 may include a material selected from among Ta, Ru, Ir, Cr, Pt, or an alloy thereof, and the top layer of the seed layer P102 may include an Ir layer. To form the seed layer P102, a CVD, PVD, ALD, reactive PLD, or sputtering process may be used.

Figure 6D:
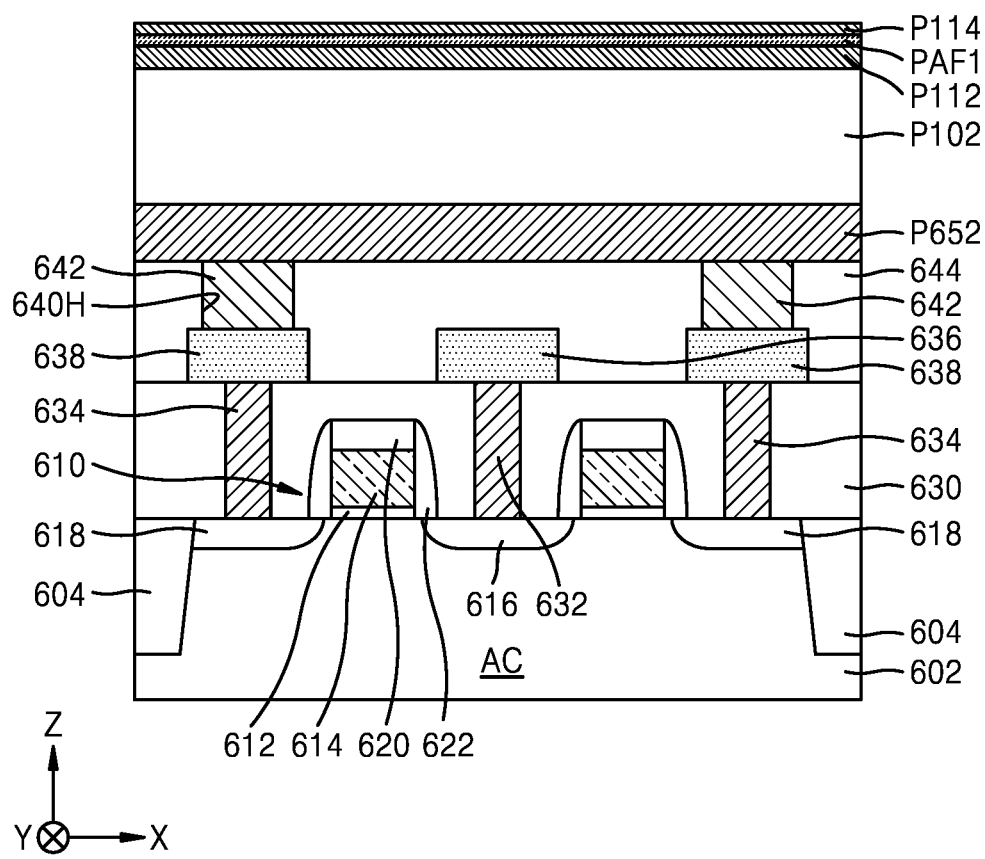

Referring to FIG. 6D, a first fixed layer P112, an antiferromagnetic coupling layer PAF1, and a second fixed layer P114 may be sequentially formed on the seed layer P102. A constituent material of each of the first fixed layer P112, the antiferromagnetic coupling layer PAF1, and the second fixed layer P114 is the same as described with respect to the first fixed pattern 112, the antiferromagnetic coupling pattern AF1, and the second fixed pattern 114 with reference to FIG. 2. Each of the first fixed layer P112, the antiferromagnetic coupling layer PAF1, and the second fixed layer P114 may be formed by a molecular beam epitaxy (MBE), metal organic chemical vapor deposition (MOCVD), or sputtering process.

Figure 6E:
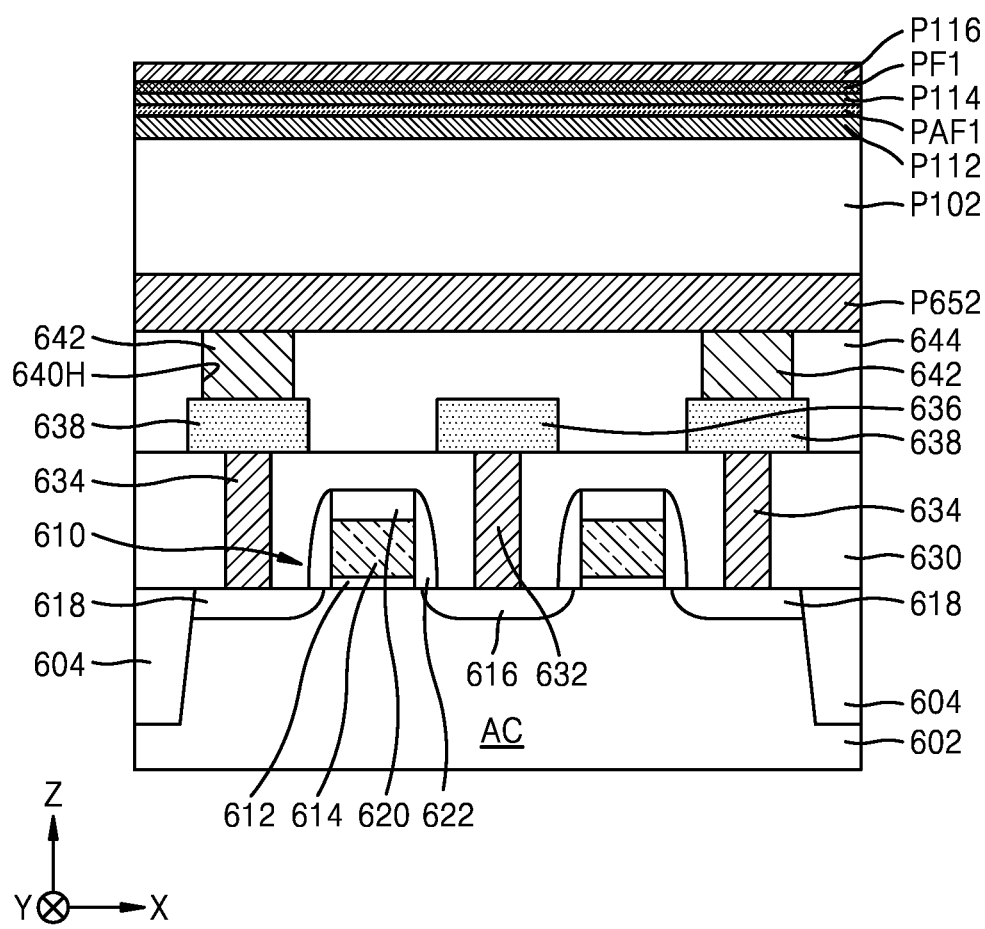

Referring to FIG. 6E, a nonmagnetic layer PF1 and a polarization reinforcement magnetic layer P116 may be sequentially formed on the second fixed layer P114. A constituent material of each of the nonmagnetic layer PF1 and the polarization reinforcement magnetic layer P116 is the same as described with respect to the nonmagnetic pattern F1 and the polarization reinforcement magnetic pattern 116 with reference to FIG. 2. To form the nonmagnetic layer PF1 and the polarization reinforcement magnetic layer P116, an MBE, MOCVD, or sputtering process may be used.

Figure 6F:
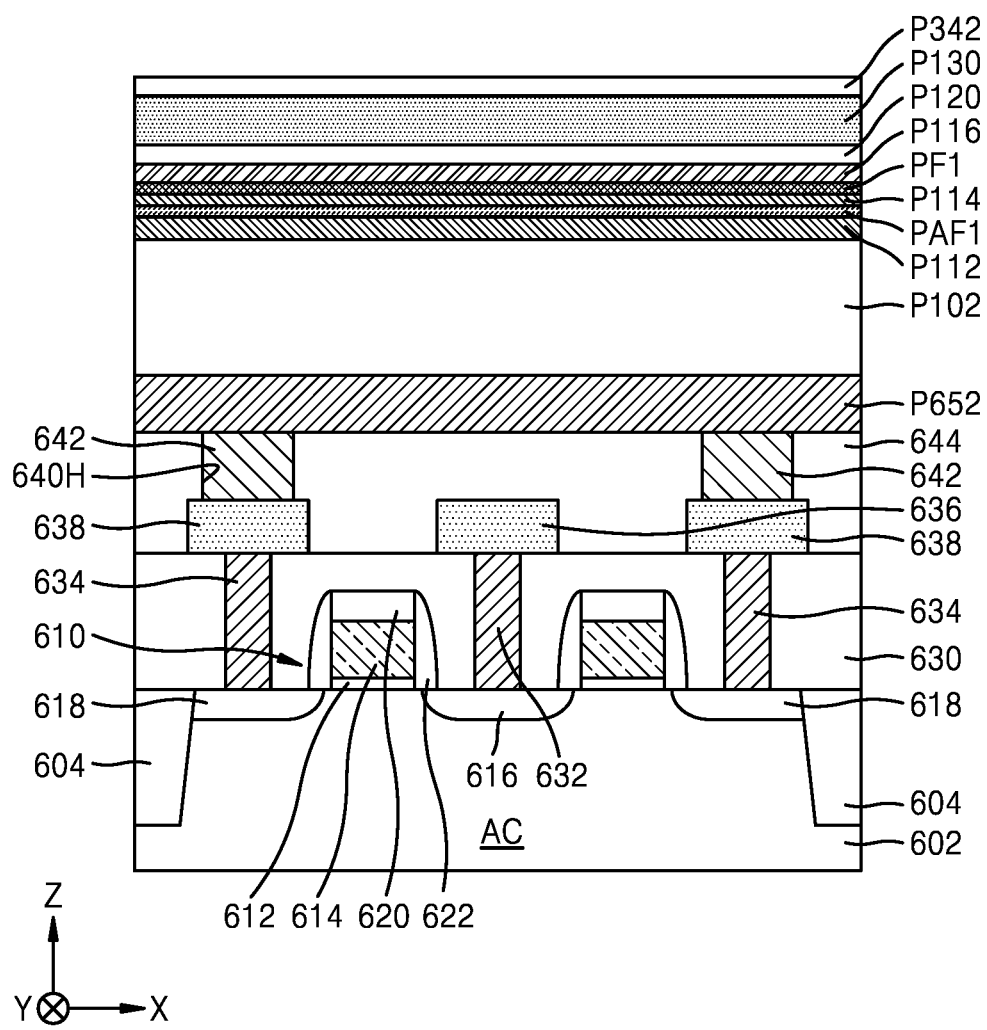

Referring to FIG. 6F, a tunnel barrier layer P120, a free magnetic layer P130, and a metal oxide capping layer P342 may be formed on the polarization reinforcement magnetic layer P116. A constituent material of each of the tunnel barrier layer P120, the free magnetic layer P130, and the metal oxide capping layer P342 is the same as described with respect to the tunnel barrier 120, the free magnetic pattern 130, and the metal oxide capping pattern 342 with reference to FIGS. 1 to 4.

Figure 6G:
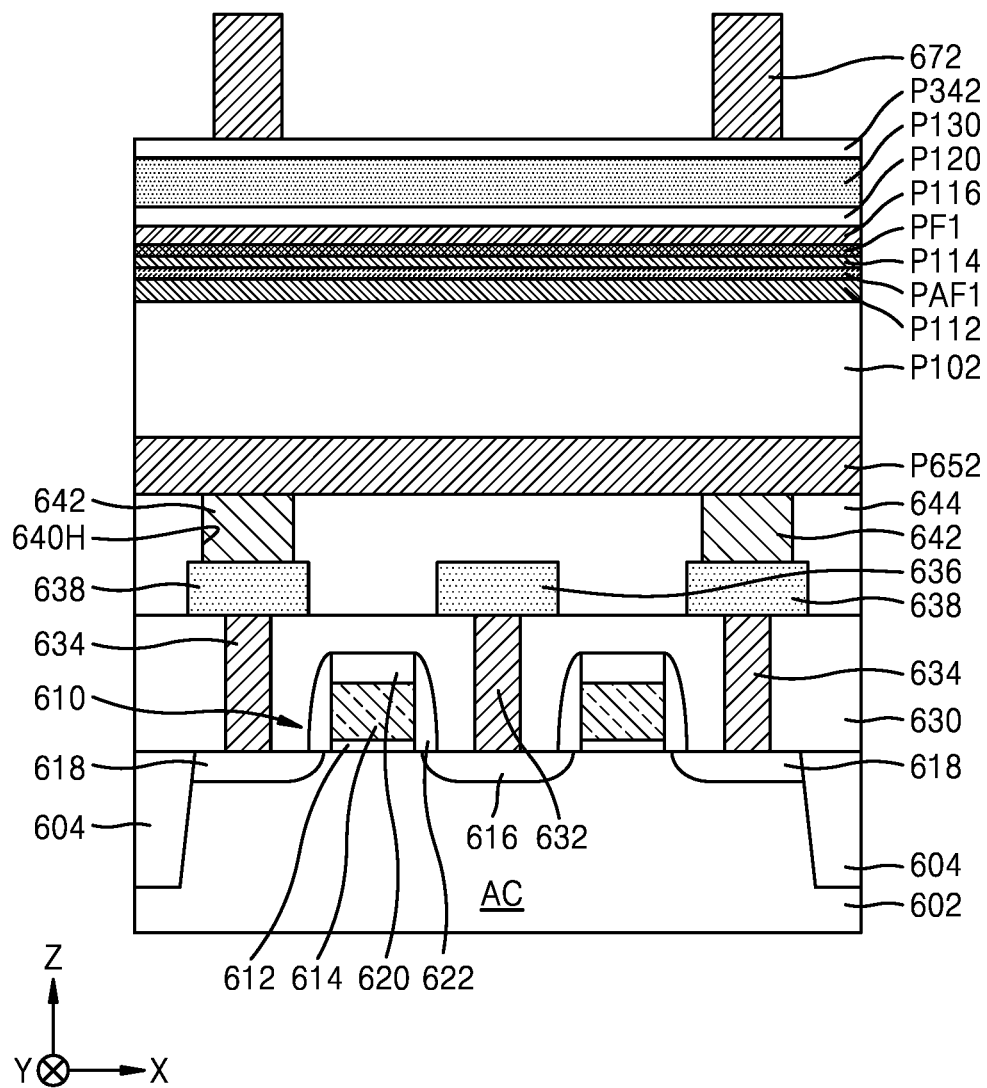

Referring to FIG. 6G, the plurality of conductive mask patterns 672 may be formed on the metal oxide capping layer P342. The plurality of conductive mask patterns 672 may be formed to be respectively on the same axes (i.e., vertically aligned with) as the plurality of lower electrode contact plugs 642 in the vertical direction (the Z direction).

Figure 6H:
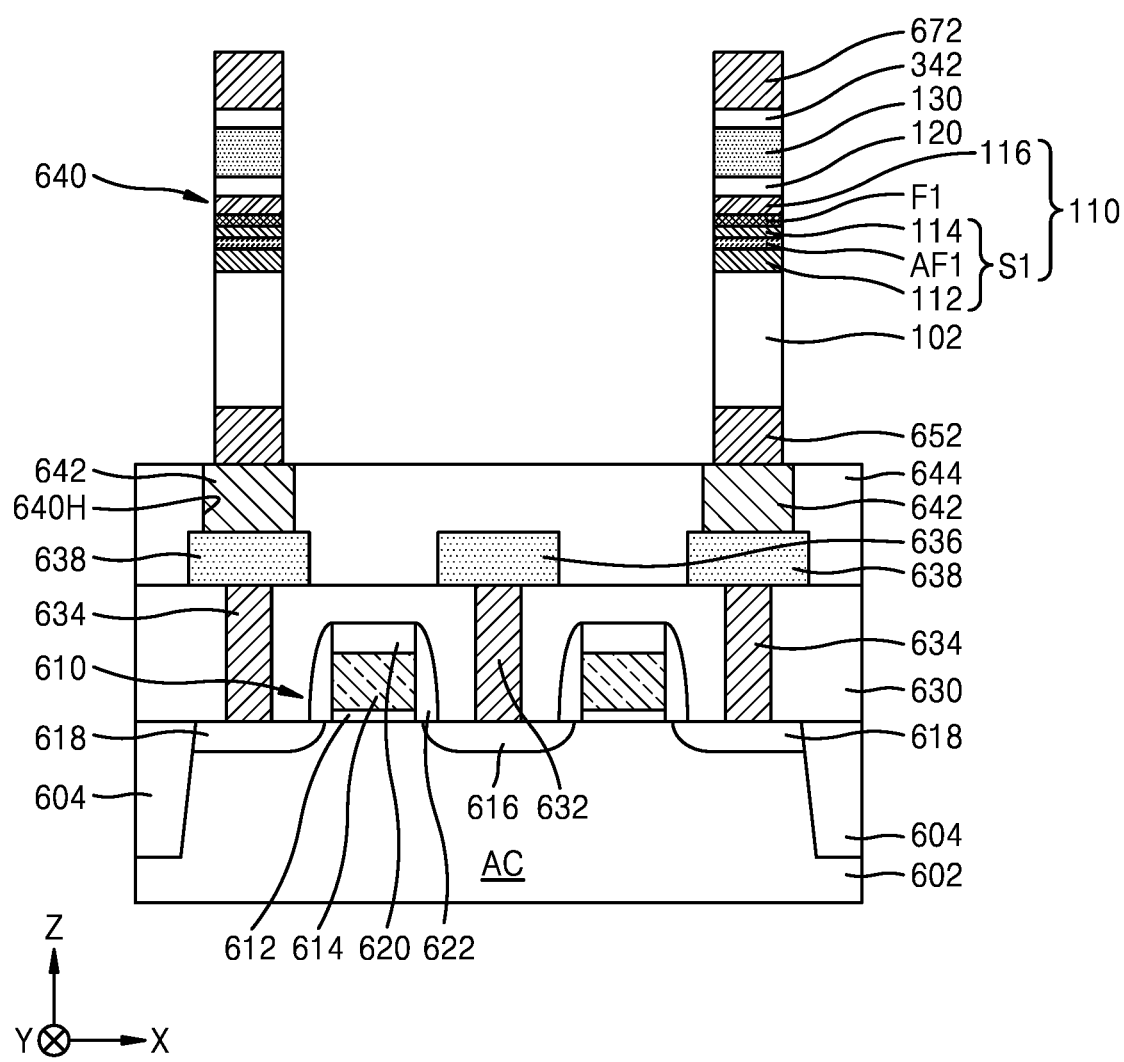

Referring to FIG. 6H, the plurality of MTJ structures 640 may be formed by using the plurality of conductive mask patterns 672 as an etching mask to etch a portion of a result of FIG. 6G.

In example embodiments, to form the plurality of MTJ structures 640, the result of FIG. 6G is loaded inside a plasma etching chamber, and then, an etching process may be performed on a portion of the result of FIG. 6G by using the plurality of conductive mask patterns 672 as an etching mask. In example embodiments, the etching process may be performed by using a reactive ion etching (RIE), ion beam etching (IBE), or argon (Ar) milling process. In example embodiments, the etching process may be performed by using plasma formed from an inductively coupled plasma (ICP) source, a capacitively coupled plasma (CCP) source, an electron cyclotron resonance (ECR) plasma source, a helicon-wave excited plasma (HWEP) source, or an adaptively coupled plasma (ACP) source.

While performing the etching process, a thickness of the plurality of conductive mask patterns 672 may be reduced by removing portions from upper surfaces of the plurality of conductive mask patterns 672 by an etching atmosphere. In a result of FIG. 6H, remaining portions of the plurality of conductive mask patterns 672 may form the second electrode E2 shown in FIG. 1.

Figure 6I:
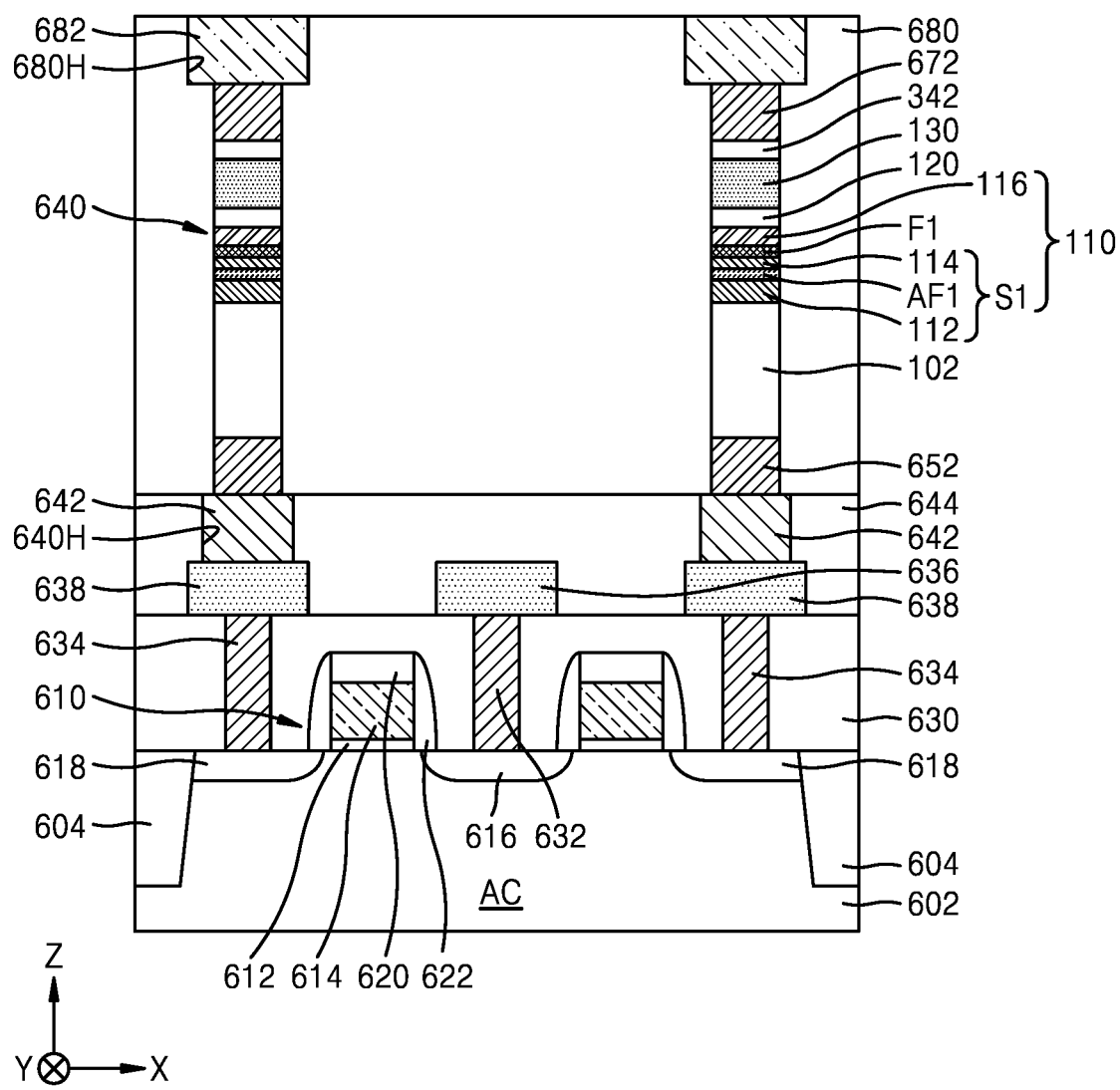

Referring to FIG. 6I, in the result of FIG. 6H, the third interlayer insulating layer 680 covering the plurality of MTJ structures 640 and the plurality of conductive mask patterns 672 may be formed, and the plurality of bit line contact holes 680H may be formed by removing a partial region of the third interlayer insulating layer 680 through etching so that the upper surfaces of the plurality of conductive mask patterns 672 are exposed. Thereafter, a conductive layer filling the insides of the plurality of bit line contact holes 680H may be formed, and then, the conductive layer may be polished or etched back so that an upper surface of the third interlayer insulating layer 680 is exposed, thereby forming the plurality of bit line contact plugs 682 in the plurality of bit line contact holes 680H.

Figure 6J:
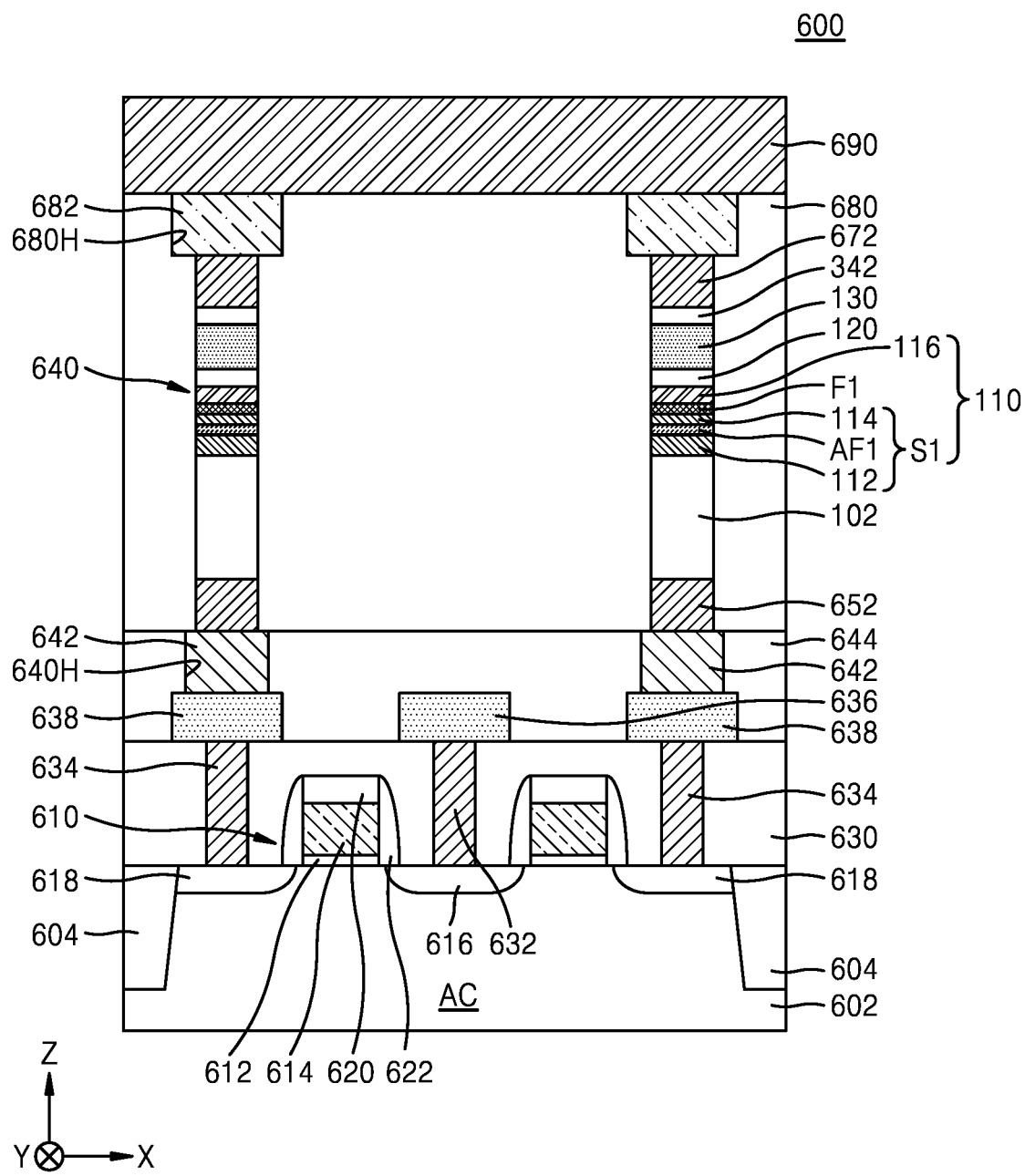

Referring to FIG. 6J, a conductive layer for forming a bit line may be formed on the third interlayer insulating layer 680 and the plurality of bit line contact plugs 682, and the conductive layer may be patterned to form the bit line 690 electrically connected to the plurality of bit line contact plugs 682, thereby manufacturing the magnetic device 600 shown in FIG. 5.

Figure 7:
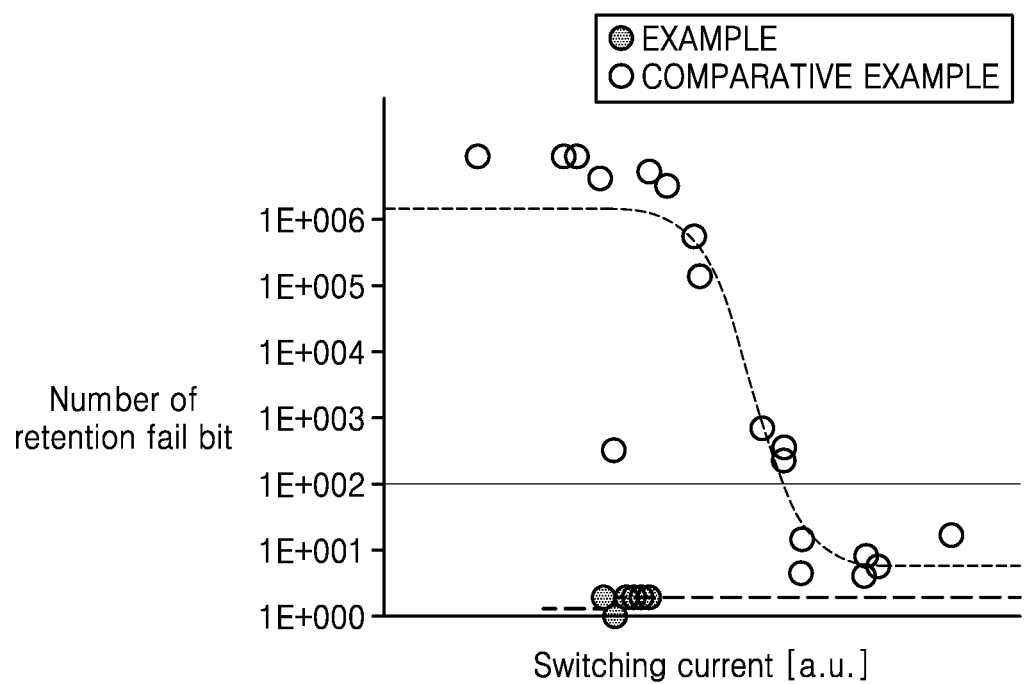
FIG. 7 is a graph illustrating a result obtained by evaluating a data retention characteristic in a free magnetic pattern of a magnetic device according to an embodiment of the inventive concept.

FIG. 7 is a graph illustrating a result obtained by evaluating a data retention characteristic in a free magnetic pattern of a magnetic device based on the number of fail bits, according to an embodiment of the inventive concept. FIG. 7 also shows a result obtained by evaluating a data retention characteristic in a free magnetic pattern of a magnetic device, according to a comparative example.

In FIG. 7, to evaluate a data retention characteristic of a magnetic device according to an embodiment of the inventive concept, a magnetic device (indicated as "EXAMPLE" in FIG. 7) having the structure described with reference to FIG. 4 is used. Herein, a stack structure of Ta/Ru/Ir is employed as the seed pattern 102 similarly to that described with respect to the seed pattern 202 with reference to FIG. 2, a stack structure of Co/Ir/Co is employed as the SAF structure S1, an Mo layer is formed as the nonmagnetic pattern F1, and a CoFeB layer is formed as the polarization reinforcement magnetic pattern 116.

In FIG. 7, to evaluate a data retention characteristic of a magnetic device according to the comparative example (indicated as "COMPARATIVE EXAMPLE"), a comparative sample having the same structure as the embodiment of the inventive concept ("EXAMPLE") except that an SAF structure having a stack structure of CoPt alloy/Ir/Co/Ir/Co/Ir/Co is formed instead of the SAF structure S1 having the stack structure of Co/Ir/Co is prepared.

In a result of FIG. 7, according to the embodiment of the inventive concept ("EXAMPLE"), when the same switching current is applied, the data retention characteristic in the free magnetic structure is improved up to about $10^5$ times the comparative example ("COMPARATIVE EXAMPLE").

In addition, when the average roughness (Ra) of a vertical cross-section of an MTJ structure is measured for each of the magnetic device according to the embodiment of the inventive concept ("EXAMPLE") and the magnetic device according to the comparative example ("COMPARATIVE EXAMPLE") by using an atomic force microscope (AFM), Ra of about 0.087 Å is obtained from the magnetic device according to the comparative example ("COMPARATIVE EXAMPLE"), whereas Ra of about 0.076 Å is obtained from the magnetic device according to the embodiment of the inventive concept ("EXAMPLE"). From this result, in a magnetic device according to embodiments of the inventive concept, the SAF structure S1 is simplified, and the thickness of the reference magnetic structure 110 in the vertical direction (the Z direction) is reduced, thereby reducing average roughness. As described above, in a magnetic device according to embodiments of the inventive concept, the average roughness of a vertical cross-section of an MTJ structure is relatively small, and thus, a decrease in a tunnel magnetoresistance (TMR) ratio of an MTJ device and a decrease in magnetic anisotropy of the MTJ device may be suppressed.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

While the inventive concept has been particularly shown and described with reference to embodiments thereof, it will be understood that various changes in form and details may be made therein without departing from the spirit and scope of the following claims.

What is claimed is:
1. A magnetic device comprising:
a seed pattern on a substrate;
a reference magnetic structure on the seed pattern;
a free magnetic pattern on the reference magnetic structure; and
a tunnel barrier between the reference magnetic structure and the free magnetic pattern,
wherein the reference magnetic structure comprises:
a synthetic antiferromagnetic (SAF) structure comprising a first fixed pattern in contact with an upper surface of the seed pattern, an antiferromagnetic coupling pattern in contact with an upper surface of the first fixed pattern, and a second fixed pattern in contact with an upper surface of the antiferromagnetic coupling pattern;
a nonmagnetic pattern in contact with an upper surface of the second fixed pattern; and
a polarization reinforcement magnetic pattern in contact with an upper surface of the nonmagnetic pattern,
wherein each of the first fixed pattern and the second fixed pattern consists of a single layer comprising cobalt (Co), and the antiferromagnetic coupling pattern consists of a single layer comprising iridium (Ir).
2. The magnetic device of claim 1, wherein the first fixed pattern comprises a fixed magnetization direction that is perpendicular to the upper surface of the first fixed pattern, and a first thickness of the first fixed pattern in a vertical direction is greater than a second thickness of the second fixed pattern in the vertical direction.

3. The magnetic device of claim 1, wherein the nonmagnetic pattern comprises a nonmagnetic material having a ferromagnetic coupling characteristic.

4. The magnetic device of claim 2, wherein the seed pattern has a top layer in direct contact with a lower surface of the first fixed pattern, and each of the first fixed pattern and the top layer has a face centered cubic (FCC) lattice structure.

5. The magnetic device of claim 2, wherein the first fixed pattern consists of cobalt (Co), wherein the seed pattern consists of iridium (Ir), and wherein a top layer of the seed pattern is in direct contact with a lower surface of the first fixed pattern.

6. The magnetic device of claim 5, wherein a <111> orientation of a face centered cubic (FCC) lattice structure is maintained over an entirety of the first thickness of the first fixed pattern.

7. A magnetic device comprising:
a seed pattern; and
a magnetic tunnel junction (MTJ) structure on the seed pattern,
wherein the MTJ structure comprises a reference magnetic structure, a free magnetic pattern, and a tunnel barrier between the reference magnetic structure and the free magnetic pattern,
wherein the reference magnetic structure consists of one synthetic antiferromagnetic (SAF) structure, a polarization reinforcement magnetic pattern, and a nonmagnetic pattern between the one SAF structure and the polarization reinforcement magnetic pattern, and
wherein the one SAF structure consists of:
a first fixed pattern consisting of cobalt (Co) and in direct contact with an upper surface of the seed pattern, wherein the upper surface of the seed pattern comprises iridium (Ir);
an antiferromagnetic coupling pattern in contact with an upper surface of the first fixed pattern; and
a second fixed pattern comprising Co and having a lower surface in contact with an upper surface of the antiferromagnetic coupling pattern and an upper surface in contact with a lower surface of the nonmagnetic pattern.

8. The magnetic device of claim 7, wherein the seed pattern comprises a tantalum (Ta) layer, a ruthenium (Ru) layer, and an iridium (Ir) layer sequentially stacked with the Ru layer in direct contact with the Ir layer, and the Ru layer is separated from the first fixed pattern with the Ir layer therebetween.

9. The magnetic device of claim 7, wherein a first thickness of the first fixed pattern in a vertical direction is greater than a second thickness of the second fixed pattern in the vertical direction.

10. The magnetic device of claim 7, wherein the second fixed pattern consists of Co, and the antiferromagnetic coupling pattern consists of iridium (Ir).

11. The magnetic device of claim 7, wherein a thickness of the reference magnetic structure in a vertical direction is less than a thickness of the seed pattern in the vertical direction.

12. The magnetic device of claim 7, wherein the nonmagnetic pattern consists of a single nonmagnetic material layer having a lower surface in direct contact with the upper surface of the second fixed pattern and an upper surface in direct contact with a lower surface of the polarization reinforcement magnetic pattern.

13. The magnetic device of claim 7, wherein the polarization reinforcement magnetic pattern has a lower surface in direct contact with an upper surface of the nonmagnetic pattern, and the polarization reinforcement magnetic pattern is configured to be ferromagnetically coupled to the SAF structure by the nonmagnetic pattern.

14. The magnetic device of claim 7, wherein a thickness of each of the antiferromagnetic coupling pattern and the second fixed pattern in a vertical direction is less than a thickness of the first fixed pattern in the vertical direction.

15. The magnetic device of claim 7, wherein the seed pattern comprises an iridium (Ir) layer in direct contact with a lower surface of the first fixed pattern, and a thickness of the Ir layer in a vertical direction is greater than a thickness of the first fixed pattern in the vertical direction.

16. A magnetic device comprising:
a first electrode and a second electrode on a substrate and separated from each other in a vertical direction; and
a seed pattern and a magnetic tunnel junction (MTJ) structure sequentially stacked in the vertical direction between the first electrode and the second electrode,
wherein the MTJ structure comprises a reference magnetic structure, a free magnetic pattern, and a tunnel barrier between the reference magnetic structure and the free magnetic pattern,
wherein the reference magnetic structure consists of one synthetic antiferromagnetic (SAF) structure, a polarization reinforcement magnetic pattern, and a nonmagnetic pattern between the one SAF structure and the polarization reinforcement magnetic pattern, and
wherein the one SAF structure consists of:
a first fixed pattern consisting of cobalt (Co) and in direct contact with an upper surface of the seed pattern, wherein the upper surface of the seed pattern comprises iridium (Ir);
an antiferromagnetic coupling pattern comprising an iridium (Ir) layer and in contact with an upper surface of the first fixed pattern; and
a second fixed pattern comprising Co and having a lower surface in contact with an upper surface of the antiferromagnetic coupling pattern and an upper surface in contact with a lower surface the nonmagnetic pattern.

17. The magnetic device of claim 16, wherein a thickness of the second fixed pattern in the vertical direction is less than a thickness of the first fixed pattern in the vertical direction, the first fixed pattern has a thickness of about 7 Angstroms (Å) to about 15 Å, and the second fixed pattern has a thickness of about 3 Å to about 7 Å.

18. The magnetic device of claim 17, wherein the seed pattern comprises a tantalum (Ta) layer, a ruthenium (Ru) layer, and an iridium (Ir) layer sequentially stacked on the substrate with the Ru layer in direct contact with the Ir layer and the Ir layer in direct contact with a lower surface of the first fixed pattern, and a thickness of the reference magnetic structure in the vertical direction is less than a thickness of the seed pattern in the vertical direction.

* * * * *